United States Patent
Bao et al.

(10) Patent No.: US 10,950,158 B2
(45) Date of Patent: Mar. 16, 2021

(54) DISPLAY APPARATUS AND DISPLAY METHOD THEREFOR

(71) Applicants: Hefei Xinsheng Optoelectronics Technology Co., Ltd., Anhui (CN); BOE Technology Group Co., Ltd., Beijing (CN)

(72) Inventors: Wenchao Bao, Beijing (CN); Qinghua Zou, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/557,082

(22) Filed: Aug. 30, 2019

(65) Prior Publication Data

US 2020/0098301 A1   Mar. 26, 2020

(30) Foreign Application Priority Data

Sep. 20, 2018  (CN) .......................... 201811101630.2

(51) Int. Cl.
*H01L 27/32* (2006.01)
*G09G 3/20* (2006.01)
*G09G 3/3208* (2016.01)

(52) U.S. Cl.
CPC ......... *G09G 3/2003* (2013.01); *G09G 3/3208* (2013.01); *H01L 27/3213* (2013.01);
(Continued)

(58) Field of Classification Search
CPC ........ H01L 27/3211; G09G 2320/0666; G09G 2320/043; G09G 2320/0295; G09G 2300/0452; G09G 3/3208; G09G 3/2003
See application file for complete search history.

(56) References Cited

U.S. PATENT DOCUMENTS 6,677,958 B2 * 1/2004 Cottone ............... G09G 3/2003
                                                        345/589
8,836,737 B2 * 9/2014 Moriya ................ G09G 3/3607
                                                        345/694

(Continued)

FOREIGN PATENT DOCUMENTS

CN        101984487 A       3/2011
CN        103460273 A      12/2013
(Continued)

OTHER PUBLICATIONS

Andrew Zimmerman Jones, The Visible Light Spectrum: Understanding the Parts of White Light, made available Jun. 26, 2017, https://wwww.thoughtco.com/he-visible-light-spectrum-2699036, p. 4 (Year: 2017).*

(Continued)

*Primary Examiner* — Mihir K Rayan
(74) *Attorney, Agent, or Firm* — Nath, Goldberg & Meyer; Joshua B. Goldberg

(57) ABSTRACT

The present disclosure provides a display apparatus, including: a plurality of pixels, at least one of which includes a red sub-pixel, a green sub-pixel, a first blue sub-pixel and a second blue sub-pixel. Blue light emitted by the first blue sub-pixel has a wave band of 400~540 nm and blue light emitted by the second blue sub-pixel has a wave band of 420~580 nm. The red sub-pixel and the green sub-pixel are combined with the first blue sub-pixel or the second blue sub-pixel to perform a RGB three-primary-color display. The present disclosure further provides a display method for the display apparatus.

20 Claims, 3 Drawing Sheets

(52) U.S. Cl.
CPC ............... *G09G 2300/0452* (2013.01); *G09G 2320/0295* (2013.01); *G09G 2320/043* (2013.01); *G09G 2320/0666* (2013.01)

(56) References Cited

U.S. PATENT DOCUMENTS

| | | | |
|---|---|---|---|
| 8,902,245 B2* | 12/2014 | So ..................... | G09G 3/3208 345/589 |
| 9,343,022 B2* | 5/2016 | Park ................... | G09G 3/3614 |
| 9,536,474 B2* | 1/2017 | Ren ..................... | G09G 3/3233 |
| 9,595,221 B2* | 3/2017 | Hamer ................ | G09G 3/3208 |
| 2004/0036421 A1* | 2/2004 | Arnold ................ | G09G 3/3216 315/169.3 |
| 2005/0275912 A1* | 12/2005 | Chen ................... | H04N 17/02 358/523 |
| 2007/0085862 A1* | 4/2007 | Moriya ............... | G09G 3/2003 345/694 |
| 2008/0224968 A1* | 9/2008 | Kashiwabara ...... | H01L 27/3213 345/83 |
| 2008/0252653 A1* | 10/2008 | Alessi ................. | G09G 3/3208 345/589 |
| 2009/0086133 A1* | 4/2009 | Chu Ke ............... | G09G 3/2003 349/106 |
| 2012/0098871 A1* | 4/2012 | Park ................... | G09G 3/36 345/690 |
| 2012/0256938 A1* | 10/2012 | So ..................... | G09G 3/3208 345/589 |
| 2013/0070006 A1* | 3/2013 | Yang ................... | G09G 3/3225 345/694 |

FOREIGN PATENT DOCUMENTS

| | | |
|---|---|---|
| CN | 103489401 A | 1/2014 |
| CN | 104933981 A | 9/2015 |
| CN | 105261635 A | 1/2016 |
| CN | 105741815 A | 7/2016 |
| CN | 106782302 A | 5/2017 |
| CN | 107450212 A | 12/2017 |
| KR | 20110059167 A | 6/2011 |

OTHER PUBLICATIONS

First Office Action dated Nov. 26, 2019, for corresponding Chinese application 201811101630.2.

* cited by examiner

| W(100nt) | CIEx | CIEy | contribution ration of a sub-pixel | NTSC |
|---|---|---|---|---|
|  | 0.33 | 0.33 |  |  |
| R | 0.66 | 0.34 | 0.3356 |  |
| G | 0.21 | 0.68 | 0.6069 | 97% |
| B1 | 0.14 | 0.05 | 0.0576 |  |
| R | 0.66 | 0.34 | 0.345 |  |
| G | 0.21 | 0.68 | 0.470 | 84% |
| B2 | 0.14 | 0.14 | 0.186 |  |

DISPLAY APPARATUS AND DISPLAY METHOD THEREFOR

CROSS REFERENCE TO RELATED APPLICATIONS

The present application claims the priority of the Chinese Patent Application with the Application No. 201811101630.2, filed on Sep. 20, 2018, which is incorporated herein in its entirety by reference.

TECHNICAL FIELD

The present disclosure relates to the field of display technology, and particularly relates to a display apparatus and a display method for the display apparatus.

BACKGROUND

An existing OLED (Organic Light Emitting Diode) display is a self-luminescence display that does not need a backlight compared with an LCD (Liquid Crystal Display). Thus, the OLED display is lighter and thinner. Further, the OLED display has advantages such as a higher brightness, lower power consumption, a larger viewing angle, a higher response speed, and a wider range of operating temperatures and thus is increasingly used in various display fields with a high performance.

SUMMARY

The present disclosure provides a display apparatus, including a plurality of pixels, at least one of which includes a red sub-pixel, a green sub-pixel, a first blue sub-pixel and a second blue sub-pixel; blue light emitted by the first blue sub-pixel has a wave band of 400~540 nm and blue light emitted by the second blue sub-pixel has a wave band of 420~580 nm, and the red sub-pixel and the green sub-pixel are combined with the first blue sub-pixel or the second blue sub-pixel to perform a RGB three-primary-color display.

In an embodiment, the plurality of pixels are arranged in a plurality of rows and a plurality of columns; and the red sub-pixel, the green sub-pixel, the first blue sub-pixel and the second blue sub-pixel in each of the plurality of pixels are arranged in one row; or the red sub-pixel, the green sub-pixel, the first blue sub-pixel and the second blue sub-pixel in each of the plurality of pixels are arranged in two rows and two columns.

In an embodiment, the red sub-pixel, the green sub-pixel, the first blue sub-pixel and the second blue sub-pixel in each of the plurality of pixels have a same size.

In an embodiment, the display apparatus further includes a chromaticity coordinate obtaining part configured to obtain chromaticity coordinates of the plurality of pixels based on data of an image to be displayed on the display apparatus; a determination part configured to determine whether a chromaticity coordinate of any one of the plurality of pixels is in a first predefined color gamut; the first predefined color gamut is formed by connecting three respective points at chromaticity coordinates of red color, green color and second blue color of first three primary colors corresponding to the red sub-pixel, the green sub-pixel and the second blue sub-pixel with three straight lines; and a controller configured to control the second blue sub-pixel in the pixel to display together with the red sub-pixel and the green sub-pixel if the chromaticity coordinate of the pixel is in the first predefined color gamut; and to control the first blue sub-pixel in the pixel to display together with the red sub-pixel and the green sub-pixel if the chromaticity coordinate of the pixel is not in the first predefined color gamut.

In an embodiment, the display apparatus further includes a color gamut obtaining part configured to obtain the first predefined color gamut.

In an embodiment, the red sub-pixel, the green sub-pixel, the first blue sub-pixel and the second blue sub-pixel are separately controlled.

In an embodiment, the chromaticity coordinate of the red color of the first three primary colors is a chromaticity coordinate obtained by only lighting up the red sub-pixel in the pixel and turning off the green sub-pixel and the first and the second sub-pixels blue in the pixel; the chromaticity coordinate of the green color of the first three primary colors is a chromaticity coordinate obtained by only lighting up the green sub-pixel in the pixel and turning off the red sub-pixel and the first and second blue sub-pixels; and the chromaticity coordinate of the blue color of the first three primary colors is a chromaticity coordinate obtained by only lighting up the second blue sub-pixel in the pixel and turning off the red and green sub-pixels and the first blue sub-pixels.

In an embodiment, a second predefined color gamut is formed by connecting three respective points at chromaticity coordinates of red color, green color and second blue color of second three primary colors corresponding to the red sub-pixel, the green sub-pixel and the first blue sub-pixel with three straight lines; and the chromaticity coordinate of a first color of the second three primary colors is a chromaticity coordinate obtained by only lighting up the first blue sub-pixel in the pixel and turning off the red and green sub-pixels and the second blue sub-pixels.

In an embodiment, only a part of the first predefined color gamut overlaps the second predefined color gamut.

In an embodiment, light of the second blue color has a wave peak in a range of 480~490 nm.

In an embodiment, the second blue color has a y value of greater than 0.08 in the chromaticity coordinate.

In an embodiment, a chromaticity coordinate obtaining part is further configured to analyze a color to be displayed by each pixel of the plurality of pixels based on the data of the image to be displayed on the display apparatus, thereby obtaining the chromaticity coordinate of the pixel.

The present disclosure provides a display method for a display apparatus, the display apparatus including: a plurality of pixels, at least one of which includes a red sub-pixel, a green sub-pixel, a first blue sub-pixel and a second blue sub-pixel; blue light emitted by the first blue sub-pixel has a wave band of 400~540 nm and blue light emitted by the second blue sub-pixel has a wave band of 420~580 nm, and the display method includes: driving the first blue sub-pixel or the second blue sub-pixel to perform a RGB three-primary-color display together with the red sub-pixel and the green sub-pixel based on data of an image to be displayed on the display apparatus.

In an embodiment, the driving the first blue sub-pixel or the second blue sub-pixel to perform a RGB three-primary-color display together with the red sub-pixel and the green sub-pixel based on the data of the image to be displayed on the display apparatus includes: obtaining chromaticity coordinates of the plurality of pixels based on the data of the image to be displayed on the display apparatus; determining whether a chromaticity coordinate of any one of the plurality of pixels is in a first predefined color gamut; the first predefined color gamut is formed by connecting three respective points at chromaticity coordinates of red color, green color and second blue color of first three primary colors corresponding to the red sub-pixel, the green sub-pixel and the second blue sub-pixel with three straight lines; and controlling the second blue sub-pixel in the pixel to perform the RGB three-primary-color display together with the red sub-pixel and the green sub-pixel in response to the chromaticity coordinate of the pixel in the first predefined color gamut; and controlling the first blue sub-pixel in the pixel to perform the RGB three-primary-color display together with the red sub-pixel and the green sub-pixel in response to the chromaticity coordinate of the pixel not in the first predefined color gamut.

In an embodiment, before the obtaining chromaticity coordinates of the plurality of pixels, the display method further includes: obtaining the first predefined color gamut.

In an embodiment, the plurality of pixels are arranged in a plurality of rows and a plurality of columns; the red sub-pixel, the green sub-pixel, the first blue sub-pixel and the second blue sub-pixel in each of the plurality of pixels are arranged in one row; or the red sub-pixel, the green sub-pixel, the first blue sub-pixel and the second blue sub-pixel in each of the plurality of pixels are arranged in two rows and two columns.

In an embodiment, the red sub-pixel, the green sub-pixel, the first blue sub-pixel and the second blue sub-pixel in each of the plurality of pixels have a same size.

In an embodiment, the obtaining chromaticity coordinates of the plurality of pixels based on the data of the image to be displayed on the display apparatus includes: analyzing a color to be displayed by each pixel of the plurality of pixels based on the data of the image to be displayed on the display apparatus, thereby obtaining a chromaticity coordinate of the pixel.

DETAIL DESCRIPTION OF EMBODIMENTS

Figure 1:
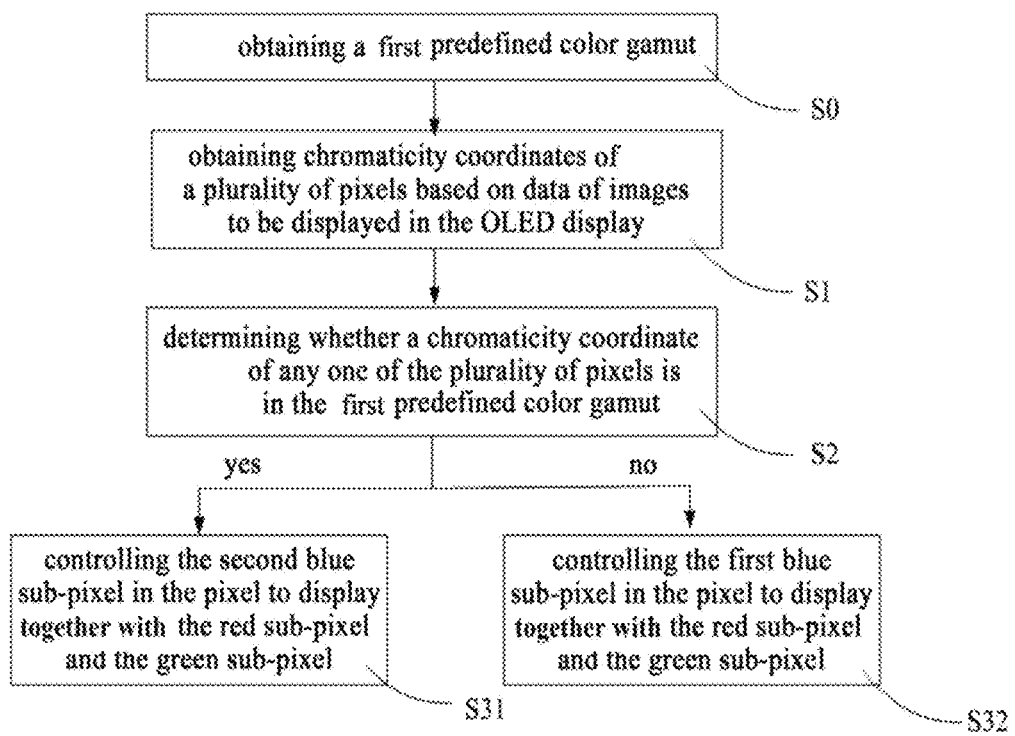
FIG. 1 is a flowchart of a display method for a display apparatus according to an embodiment of the present disclosure.

A display apparatus and a display method for the display apparatus of the present disclosure will be described in details below in conjunction with the accompanying drawings and the detailed description of embodiments for those skilled in the art to better understand the technical solution of the present disclosure.

Unless otherwise defined, technical terms or scientific terms used in the present disclosure shall have a common meaning as understood by those with generic skills in the art where the present disclosure pertains to. Ordinals (such as first and second or the like) used in the present disclosure do not represent any particular order, quantity or significance, but are only used for distinguishing different components.

Nowadays, the OLED display displays images by means of red light emitted by a red sub-pixel, green light emitted by a green sub-pixel and blue light emitted by a blue sub-pixel, and the red sub-pixel, the green sub-pixel and the blue sub-pixel are arranged in a particular manner. In order to achieve a larger color gamut for the OLED display, the blue sub-pixel in a current OLED display in the art emits deep blue light, i.e., the blue light CIE (Commission International de L'Eclairage) (0.14, 0.05), which has a wave band of 400~540 nm. However, short wave blue light having a wave band of 400~450 nm in the visible light tends to damage human eyes. Thus, the wave band of the deep blue light emitted by the current OLED display in the art entirely covers the wave band of the short wave blue light that tends to damage human eyes. Thus, eyes of a user can be easily damaged by the deep blue light emitted by the current OLED display.

The present disclosure provides a display apparatus and a display method for the display apparatus. In an embodiment of the present disclosure, the display apparatus is illustrated taking the OLED display as an example. In other embodiments of the present disclosure, the display apparatus may be a liquid crystal display.

Specifically, the OLED display includes a plurality of pixels, each of which at least includes a red sub-pixel R, a green sub-pixel G, a first blue sub-pixel B1 and a second blue sub-pixel B2; where blue light emitted by the first blue sub-pixel B1 has a wave band of 400~540 nm and blue light emitted by the second blue sub-pixel B2 has a wave band of 420~580 nm.

It should be understood that, the red sub-pixels R, the green sub-pixels G, the first blue sub-pixels B1 and the second blue sub-pixels B2 may be separately controlled, that is, each sub-pixel is driven by a separate circuit.

Thus, each pixel in this embodiment includes two blue sub-pixels. That is, the first blue sub-pixel B1 which is a conventional deep blue sub-pixel and emits deep blue light; and the second blue sub-pixel B2 which is a sky blue sub-pixel and emits sky blue light. For the OLED display, the first blue sub-pixel B1 and the second blue sub-pixel B2 may be manufactured by adjusting a main material and a doping material of an organic light emitting layer of each of the sub-pixels, which will not be described in detail herein. In contrast, for a liquid crystal display, sub-pixels with different colors may be implemented by using different color filters.

In an embodiment of the present disclosure, the first blue sub-pixel B1 emits light with a wave peak in a range of 450~460 nm, which has a y value of less than 0.08 in the CIExyY coordinates; the second blue sub-pixel B2 emits light with a wave peak in a range of 480~490 nm, which has a y value of greater than 0.08 in the CIExyY coordinates.

That is, the sky blue light and the deep blue light may be defined according to parameters such as the above wave peaks and the CIExyY coordinates.

Figure 2:
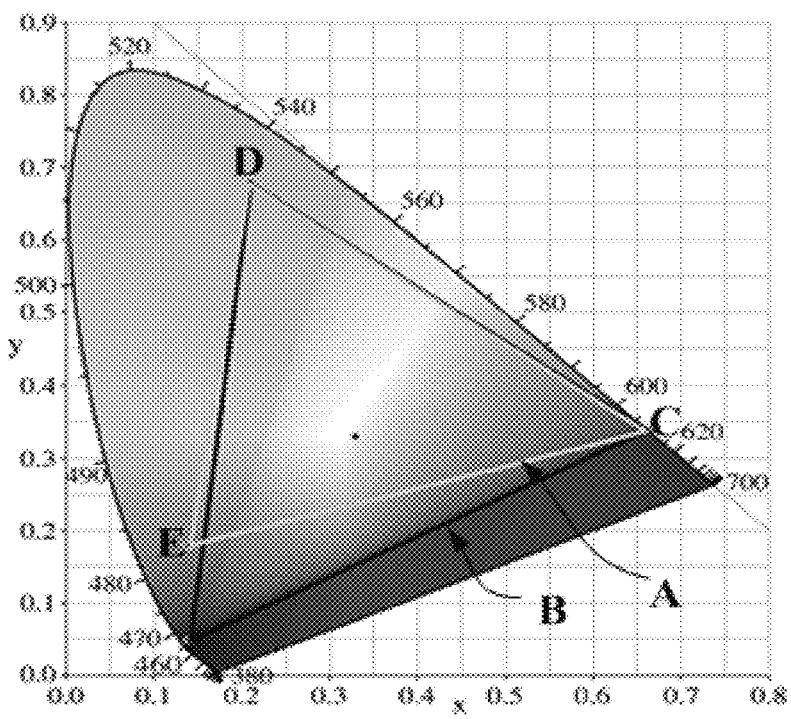
FIG. 2 is a CIExyY chromaticity diagram for a display apparatus according to an embodiment of the present disclosure.

FIG. 1 is a flowchart of a display method for a display apparatus according to an embodiment of the present disclosure; and FIG. 2 is a CIExyY chromaticity diagram for a display apparatus according to an embodiment of the present disclosure. As shown in FIG. 1, the display method for a display apparatus according to an embodiment of the present disclosure includes the following steps: S0, obtaining a first predefined color gamut; S1, obtaining chromaticity coordinates of a plurality of pixels based on data of an image to be displayed on the OLED display; S2, determining whether a chromaticity coordinate of any one of the plurality of pixels is in the first predefined color gamut; if so, performing a step S31: controlling the second blue sub-pixel B2 in the pixel to display together with the red sub-pixel R and the green sub-pixel G; and if not, performing a step S32: controlling the first blue sub-pixel B1 in the pixel to display together with the red sub-pixel R and the green sub-pixel G.

Specifically, at the step S0, in the CIExyY chromaticity diagram for the display apparatus as shown in FIG. 2, light of any specific color (which is obtained by mixing light of specific wavelengths in proportion) has one respective chromaticity coordinate in the color gamut. For example, monochromatic light of a wavelength in a range of 380~700 nm has a chromaticity coordinate at a corresponding point on the curve of the colored area in FIG. 2.

The first predefined color gamut is represented by the triangle A in FIG. 2, which is formed by connecting points at the chromaticity coordinates of the red color corresponding to the red sub-pixel R, the green color corresponding to the green sub-pixel G and the second blue color corresponding to the second blue sub-pixel B2 of first three primary colors with straight lines, respectively. That is, three vertexes of the triangle A are the chromaticity coordinates of the red color, the green color and the blue color of the first three primary colors, respectively.

Obviously, the red sub-pixel R, the green sub-pixel G and the second blue sub-pixel B2 emit the red light, the green light and the sky blue light, respectively, each of which may have a wavelength range, rather than a single wavelength. The chromaticity coordinates corresponding to these three lights may form a triangle A, that is, the first predefined color gamut that may be obtained by the red sub-pixel R, the green sub-pixel G and the second blue sub-pixel B2.

In an embodiment, obtaining the first predefined color gamut may be implemented as below.

A measurement device such as a color analyzer is used for measuring a value of the chromaticity coordinate of light emitted by the OLED display which performs a red image display (that is, the value of the chromaticity coordinate with all of the red sub-pixels R in the OLED display lit up), a value of the chromaticity coordinate of light emitted by the OLED display which performs a green image display (that is, the value of the chromaticity coordinate with all of the green sub-pixels G in the OLED display lit up), and a value of the chromaticity coordinate of light emitted by the OLED display which performs a sky blue image display (that is, the value of the chromaticity coordinate with all of the second blue sub-pixels B2 in the OLED display lit up). Then, the value of the chromaticity coordinate of light emitted by the OLED display which performs a red image display is used as the value of the chromaticity coordinate of the red light corresponding to the red sub-pixel R in the OLED display, the value of the chromaticity coordinate of light emitted by the OLED display which performs a green image display is used as the value of the chromaticity coordinate of the green light corresponding to the green sub-pixel G in the OLED display, and the value of the chromaticity coordinate of light emitted by the OLED display which performs a sky blue image display is used as the value of the chromaticity coordinate of the sky blue light corresponding to the second blue sub-pixel B2 in the OLED display. The values of the chromaticity coordinates of these three colors are specifically shown in FIG. 3 and labeled in the CIExyY chromaticity diagram, thereby obtaining a point C at the chromaticity coordinate of the red color corresponding to the red sub-pixel R, a point D at the chromaticity coordinate of the green color corresponding to the green sub-pixel G, and a point E at the chromaticity coordinate of the sky blue color corresponding to the second blue sub-pixel B2 in the OLED display. These points at the chromaticity coordinates are connected with straight lines to obtain the first predefined color gamut (the triangle A as shown in FIG. 2) according to an embodiment of the present disclosure.

Figures 3, 4A, 4B:
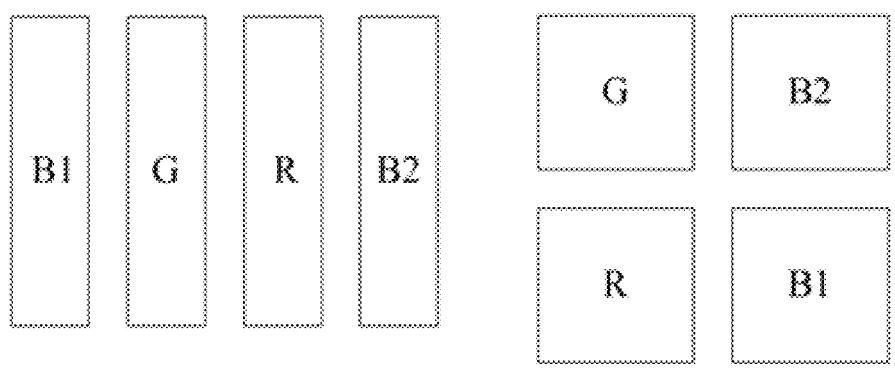
FIG. 3 is a schematic diagram illustrating that pixels including different blue sub-pixels emit white light in a display apparatus according to an embodiment of the present disclosure.
FIGS. 4a and 4b are schematic diagrams showing an arrangement of a red sub-pixel, a green sub-pixel, a first blue sub-pixel and a second blue sub-pixel in each pixel of a display apparatus according to an embodiment of the present disclosure.

FIG. 3 is a schematic diagram illustrating pixels including different blue sub-pixels emit white light together with the red sub-pixel R and the green sub-pixel G in a display apparatus according to an embodiment of the present disclosure. In FIG. 3, a percentage of NTSC (National Television Standards Committee) refers to a percentage of colors which can be obtained by sub-pixels of the corresponding colors in colors regulated under NTSC standard. The greater the percentage is, the more kinds of colors can be obtained correspondingly. It can be seen from FIG. 3 that, more kinds of colors can be obtained by using the first blue sub-pixel B1 than using the second blue sub-pixel B2.

In the step S1, a color to be displayed by each pixel may be analyzed based on data of an image to be displayed on the OLED display, thus obtaining a chromaticity coordinate of each pixel. For example, grayscale data for a respective color corresponding to each pixel is analyzed to obtain a chromaticity coordinate of the pixel.

The data of the image to be displayed is often data in an RGB format, that is, components of colors R, G and B in each pixel; and according to the components of colors R, G and B, the chromaticity coordinates of respective colors corresponding to respective pixels in the CIExyY chromaticity diagram may be computed using a known algorithm.

In the step S2, whether a chromaticity coordinate of any one of the plurality of pixels is within the first predefined color gamut is determined.

Specifically, if the chromaticity coordinate of any one of the plurality of pixels is inside the triangle A or on a side boundary of the triangle A, the step S31 is performed; if the chromaticity coordinate of any one of the plurality of pixels is outside the triangle A, the step S32 is performed.

In the step S31, the second blue sub-pixel B2 in the pixel is controlled to display together with the red sub-pixel R and the green sub-pixel G.

That is, if the color of the pixel may be obtained by the second blue sub-pixel B2 (the sky blue sub-pixel), the second blue sub-pixel B2, rather than the first blue sub-pixel B1 (the deep blue sub-pixel), is used for display.

Since a blue light emitted by the second blue sub-pixel B2 has a wave band of 420~580 nm which has a less portion which coincides with the wave band of the short wave blue light that can damage human eyes, the second blue sub-pixel B2 is controlled to display together with the red sub-pixel R and the green sub-pixel G such that damage of the light emitted by the OLED display to human eyes is reduced.

In the step S32, the first blue sub-pixel B1 in the pixel is controlled to display together with the red sub-pixel R and the green sub-pixel G.

It is noted that as shown in FIG. 2, the CIExyY chromaticity diagram further includes a triangle B which is formed by connecting the chromaticity coordinate of the red light corresponding to the red sub-pixel R, the chromaticity coordinate of the green light corresponding to the green sub-pixel G and the chromaticity coordinate of the deep blue corresponding to the first blue sub-pixel B1 of second three primary colors with straight lines, respectively. It can be seen that the triangle B is a second color gamut with an area larger than that of the first predefined color gamut. The triangle B is a second color gamut obtainable by the first blue sub-pixel B1 (the deep blue sub-pixel) of the second three primary colors. In this way, when the chromaticity coordinate of any one of the plurality of pixels is outside the first predefined color gamut, the chromaticity coordinate is in a region of the triangle B except the triangle A. Obviously, at this time, the second blue sub-pixel B2 cannot provide a color gamut larger enough for the pixel. Thus, the first blue sub-pixel B1 in the pixel is controlled to display together with the red sub-pixel R and the green sub-pixel G such that the OLED display has a larger color gamut according to an embodiment of the present disclosure.

Certainly, as shown in FIG. 2, strictly speaking, the triangle A also has a small portion beyond the triangle B, which cannot be obtained by the related art (i.e., only by the first blue sub-pixel B1), but is obtainable by the second blue sub-pixel B2 (the sky blue sub-pixel) according to an embodiment of the present disclosure. Thus, the OLED display according to an embodiment of the present disclosure provides a larger color gamut than that in the related art.

Thus, in an embodiment of the present disclosure, each pixel includes a first blue sub-pixel B1 and a second blue sub-pixel B2; where a blue light emitted by the second blue sub-pixel B2 has a wave band of 420~580 nm which has a less portion coinciding with a wave band of a short wave blue light that can damage human eyes, such that damage to human eyes is reduced. Thus, if a color of an image to be displayed is in the color gamut which is obtainable by the second blue sub-pixel B2, the color may be displayed using the second blue sub-pixel B2, while for the color gamut which is not obtainable by the second blue sub-pixel B2, the color may still be displayed using the first blue sub-pixel B1, such that damage to human eyes by the OLED display is reduced without reducing the color gamut.

A conventional blue light emitting material typically has a short lifetime. Therefore, for the same pixel, the conventional blue sub-pixel has a shorter lifetime than sub-pixels of other colors. As for the OLED display according to an embodiment of the present disclosure, only one blue sub-pixel (the first blue sub-pixel B1 or the second blue sub-pixel B2) in each pixel is operated for display, which prolongs a lifetime of the whole pixel and thus a lifetime of the OLED display according to an embodiment of the present disclosure.

In addition, since blue sub-pixels of a conventional OLED display have a shorter lifetime, for the same pixel, the conventional blue sub-pixel often has a larger area than sub-pixels of other colors. In this way, luminescence intensity in a unit area is reduced to prolong a lifetime of the conventional blue sub-pixel. However, in an embodiment of the present disclosure, since each blue sub-pixel has a shorter luminescence time, it is ensured that the blue sub-pixel has a lifetime longer than or equal to that of the red sub-pixel R or the green sub-pixel G when subjected to greater luminescence intensity. Thus, in an embodiment of the present disclosure, the red sub-pixel R, the green sub-pixel G, the first blue sub-pixel B1 and the second blue sub-pixel B2 in each pixel may have a same luminescence area. The luminescence area refers to a size of a region in each sub-pixel where the light can pass.

For better understanding of the present disclosure, an arrangement of the red sub-pixel R, the green sub-pixel G, the first blue sub-pixel B1 and the second blue sub-pixel B2 in each pixel of the OLED display according to an embodiment of the present disclosure will be described in detail below.

FIGS. 4a and 4b are schematic diagrams showing an arrangement of the red sub-pixel R, the green sub-pixel G, the first blue sub-pixel B1 and the second blue sub-pixel B2 in each pixel of a display apparatus according to an embodiment of the present disclosure.

FIG. 4a is a schematic diagram of an arrangement of the red sub-pixel R, the green sub-pixel G, the first blue sub-pixel B1 and the second blue sub-pixel B2 in each pixel of a display apparatus according to an embodiment of the present disclosure. Specifically, as shown in FIG. 4a, the red sub-pixel R, the green sub-pixel G, the first blue sub-pixel B1 and the second blue sub-pixel B2 in each pixel are arranged in a row direction of the pixel.

It is noted that in this embodiment, an order of the red sub-pixel R, the green sub-pixel G, the first blue sub-pixel B1 and the second blue sub-pixel B2 in the arrangement in the row direction in the pixel is not limited.

FIG. 4b is a schematic diagram of an arrangement of the red sub-pixel R, the green sub-pixel G, the first blue sub-pixel B1 and the second blue sub-pixel B2 in each pixel of a display apparatus according to another embodiment of the present disclosure. Specifically, as shown in FIG. 4b, the red sub-pixel R and the green sub-pixel G in each pixel are arranged in a column direction of the pixel; and the first blue sub-pixel B1 and the second blue sub-pixel B2 in each pixel are arranged in a column direction of the pixel to form a 2*2 array.

It is noted that in an embodiment of the present disclosure, an order of the red sub-pixel R, the green sub-pixel G, the first blue sub-pixel B1 and the second blue sub-pixel B2 in the 2*2 array is not limited.

Figure 5:
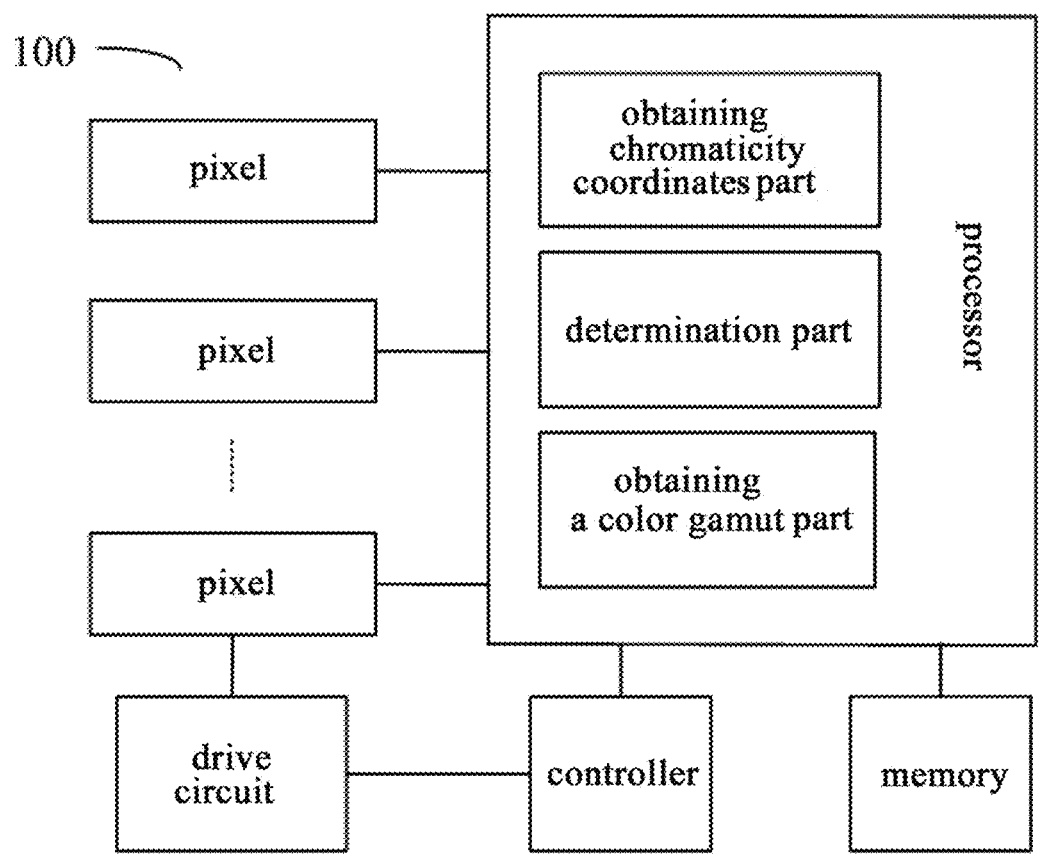
FIG. 5 is a block diagram of a display apparatus according to an embodiment of the present disclosure.

FIG. 5 is a block diagram for a display apparatus according to an embodiment of the present disclosure. The embodiment provides a display apparatus that may display images with the above display method. The display apparatus 100 according to an embodiment of the present disclosure includes a plurality of pixels, a chromaticity coordinate obtaining module, a determination module and a controller.

Specifically, in the display apparatus according to an embodiment of the present disclosure, each of the plurality of pixels includes: a red sub-pixel R, a green sub-pixel G, a first blue sub-pixel B1 and a second blue sub-pixel B2; where a blue light emitted by the first blue sub-pixel B1 has a wave band of 400~540 nm and a blue light emitted by the second blue sub-pixel B2 has a wave band of 420~580 nm; the chromaticity coordinate obtaining module is configured to obtain chromaticity coordinates of a plurality of pixels based on data of an image to be displayed on the display apparatus; the determination module is configured to determine whether a chromaticity coordinate of any one of the plurality of pixels is in a first predefined color gamut; the first predefined color gamut is formed by connecting a point at the chromaticity coordinate of the red light corresponding to the red sub-pixel R, a point at the chromaticity coordinate of the green light corresponding to the green sub-pixel G and a point at the chromaticity coordinate of the blue light corresponding to the second blue sub-pixel B2 in the display apparatus with straight lines, respectively; the controller is configured to control the second blue sub-pixel B2 in the pixel to display together with the red sub-pixel R and the green sub-pixel G if the chromaticity coordinate of any one of the plurality of pixels is in the first predefined color gamut; and to control the first blue sub-pixel B1 in the pixel to display together with the red sub-pixel R and the green sub-pixel G if the chromaticity coordinate of any one of the plurality of pixels is not in the first predefined color gamut.

In an embodiment of the present disclosure, the display apparatus further includes a color gamut obtaining module configured to obtain the first or second predefined color gamut by, for example, measurement with a measurement device such as a color analyzer.

In an embodiment of the present disclosure, the display apparatus may further include a memory for storing the obtained first or second predefined color gamut; and a processor.

The chromaticity coordinate obtaining module and the determination module of the present disclosure may be implemented in computer programs, such as implemented in functional modules integrated on the processor. The controller of the present disclosure may be connected to a gate drive circuit and a source drive circuit of the display apparatus, so as to control the gate drive circuit and the source drive circuit to drive the plurality of pixels of the display apparatus based on a result determined by the determination module.

Specifically, the display apparatus may further include a memory and a processor. It can be understood by a skilled person in the art that the display apparatus is not limited to the structure as shown in FIG. 5, but may include more or less components than those shown in the drawings, or may have combined components or different arrangements of the components.

The memory may store a software program and various data, such as the first predefined color gamut obtained by the color gamut obtaining module. In addition, the memory may include a high speed random access memory, or further include a nonvolatile memory, such as a magnetic disk storage device, a flash device or any other nonvolatile solid-state storage device.

The processor is a control core of the display apparatus and is configured to connect various components of the whole display apparatus via various interfaces and lines, and to perform various functions and process data, by running or performing the software program and/or functional modules stored in the memory and by invoking data stored in the memory, thereby implementing the display apparatus and the display method for the display apparatus according to the present disclosure.

In an embodiment of the present disclosure, the processor is further configured to execute a computer program stored in the memory, such that the color gamut obtaining module of the display apparatus obtains the first predefined color gamut using a color analyzer; such that the chromaticity coordinate obtaining module obtains chromaticity coordinates of a plurality of pixels based on data of an image to be displayed on the display apparatus; and such that the determination module determines whether a chromaticity coordinate of any one of the plurality of pixels is in the first predefined color gamut.

Further, the controller is configured to control a gate drive circuit and a source drive circuit to drive the second blue sub-pixel B2 in the pixel to perform a RGB three-primary-color display together with the red sub-pixel R and the green sub-pixel G in response to the chromaticity coordinate of any one of the plurality of pixels in the first predefined color gamut; and to control the gate drive circuit and the source drive circuit to drive the first blue sub-pixel B1 in the pixel to perform a RGB three-primary-color display together with the red sub-pixel R and the green sub-pixel G in response to the chromaticity coordinate of any one of the plurality of pixels not in the first predefined color gamut.

In an embodiment of the present disclosure, the display apparatus is an OLED display, but is not limited thereto. Thus, the display apparatus is not limited in the present disclosure.

In an embodiment of the present disclosure, since the controller may control the second blue sub-pixel B2 in the pixel to display together with the red sub-pixel R and the green sub-pixel G when the chromaticity coordinate of any one of the plurality of pixels is in the first predefined color gamut, where a blue light emitted by the second blue sub-pixel B2 has a wave band of 420~580 nm which has a less portion coinciding with a wave band of short wave blue light that may damage human eyes, such that damage to human eyes by the light emitted from the display apparatus is reduced. Meanwhile, the controller may control the first blue sub-pixel B1 in the pixel to display together with the red sub-pixel R and the green sub-pixel G when the chromaticity coordinate of any one of the plurality of pixels is beyond the first predefined color gamut, thereby obtaining a color gamut including the deep blue light corresponding to the first blue sub-pixel B1 (the deep blue sub-pixel), such that damage to human eyes by the OLED display of this embodiment is reduced without reducing the color gamut. It should be noted that in the OLED display, only one blue sub-pixel (the first blue sub-pixel B1 or the second blue sub-pixel B2) in each pixel is in operation for display, which prolongs a lifetime of the first and second blue sub-pixels and thus a lifetime of the OLED display according to the embodiment.

It should be understood that the above embodiments are merely exemplary embodiments used only for illustrating the principle of the present disclosure. However, the present disclosure is not limited thereto. Obviously, those skilled in the art can make various modifications and variants to this disclosure without departing from spirit and scope of this disclosure. As such, if these modifications and variants of this disclosure fall into the scope of the claims and their equivalents, the present disclosure intends to include these modifications and variants.

What is claimed is:

1. A display apparatus, comprising:
   a plurality of pixels, at least one of which comprises a red sub-pixel, a green sub-pixel, a first blue sub-pixel and a second blue sub-pixel; wherein
   blue light emitted by the first blue sub-pixel has a wave band of 400~540 nm and blue light emitted by the second blue sub-pixel has a wave band of 420~580 nm, and
   the red sub-pixel and the green sub-pixel are combined with the first blue sub-pixel or the second blue sub-pixel to perform a RGB three-primary-color display;
   wherein the plurality of pixels are arranged in a plurality of rows and a plurality of columns; and
   the red sub-pixel, the green sub-pixel, the first blue sub-pixel and the second blue sub-pixel in each of the plurality of pixels are arranged in one row; or the red sub-pixel, the green sub-pixel, the first blue sub-pixel and the second blue sub-pixel in each of the plurality of pixels are arranged in two rows and two columns; and
   wherein the red sub-pixel, the green sub-pixel, the first blue sub-pixel and the second blue sub-pixel in each of the plurality of pixels have a same size.

2. The display apparatus of claim 1, further comprising:
   a chromaticity coordinate obtaining part configured to obtain chromaticity coordinates of the plurality of pixels based on data of an image to be displayed on the display apparatus;
   a determination part configured to determine whether a chromaticity coordinate of any one of the plurality of pixels is in a first predefined color gamut; wherein the first predefined color gamut is formed by connecting three respective points at chromaticity coordinates of red color, green color and second blue color of first three primary colors corresponding to the red sub-pixel, the green sub-pixel and the second blue sub-pixel with three straight lines; and a controller configured to control the second blue sub-pixel in the pixel to display together with the red sub-pixel and the green sub-pixel if the chromaticity coordinate of the pixel is in the first predefined color gamut; and to control the first blue sub-pixel in the pixel to display together with the red sub-pixel and the green sub-pixel if the chromaticity coordinate of the pixel is not in the first predefined color gamut.

3. The display apparatus of claim 2, further comprising:
a color gamut obtaining part configured to obtain the first predefined color gamut.

4. The display apparatus of claim 3, wherein the chromaticity coordinate of the red color of the first three primary colors is a chromaticity coordinate obtained by only lighting up the red sub-pixel in the pixel and turning off the green sub-pixel and the first and the second sub-pixels blue in the pixel;
the chromaticity coordinate of the green color of the first three primary colors is a chromaticity coordinate obtained by only lighting up the green sub-pixel in the pixel and turning off the red sub-pixel and the first and second blue sub-pixels; and
the chromaticity coordinate of the blue color of the first three primary colors is a chromaticity coordinate obtained by only lighting up the second blue sub-pixel in the pixel and turning off the red and green sub-pixels and the first blue sub-pixels.

5. The display apparatus of claim 4, wherein a second predefined color gamut is formed by connecting three respective points at chromaticity coordinates of red color, green color and second blue color of second three primary colors corresponding to the red sub-pixel, the green sub-pixel and the first blue sub-pixel with three straight lines; and
the chromaticity coordinate of a first color of the second three primary colors is a chromaticity coordinate obtained by only lighting up the first blue sub-pixel in the pixel and turning off the red and green sub-pixels and the second blue sub-pixels.

6. The display apparatus of claim 5, wherein only a part of the first predefined color gamut overlaps the second predefined color gamut.

7. The display apparatus of claim 2, wherein a chromaticity coordinate obtaining part is further configured to analyze a color to be displayed by each pixel of the plurality of pixels based on the data of the image to be displayed on the display apparatus, thereby obtaining the chromaticity coordinate of the pixel.

8. The display apparatus of claim 1, wherein the red sub-pixel, the green sub-pixel, the first blue sub-pixel and the second blue sub-pixel are separately controlled.

9. The display apparatus of claim 1, wherein light of the second blue color has a wave peak in a range of 480~490 nm.

10. The display apparatus of claim 9, wherein the second blue color has a y value of greater than 0.08 in the chromaticity coordinate.

11. A display method for a display apparatus, the display apparatus comprising:
a plurality of pixels, at least one of which comprises a red sub-pixel, a green sub-pixel, a first blue sub-pixel and a second blue sub-pixel; wherein
blue light emitted by the first blue sub-pixel has a wave band of 400~540 nm and blue light emitted by the second blue sub-pixel has a wave band of 420~580 nm,
wherein the display method comprises: driving the first blue sub-pixel or the second blue sub-pixel to perform a RGB three-primary-color display together with the red sub-pixel and the green sub-pixel based on data of an image to be displayed on the display apparatus,
wherein the plurality of pixels are arranged in a plurality of rows and a plurality of columns;
the red sub-pixel, the green sub-pixel, the first blue sub-pixel and the second blue sub-pixel in each of the plurality of pixels are arranged in one row; or the red sub-pixel, the green sub-pixel, the first blue sub-pixel and the second blue sub-pixel in each of the plurality of pixels are arranged in two rows and two columns; and
wherein the red sub-pixel, the green sub-pixel, the first blue sub-pixel and the second blue sub-pixel in each of the plurality of pixels have a same size.

12. The display method for the display apparatus of claim 11, wherein the driving the first blue sub-pixel or the second blue sub-pixel to perform a RGB three-primary-color display together with the red sub-pixel and the green sub-pixel based on the data of the image to be displayed on the display apparatus comprises:
obtaining chromaticity coordinates of the plurality of pixels based on the data of the image to be displayed on the display apparatus;
determining whether a chromaticity coordinate of any one of the plurality of pixels is in a first predefined color gamut; wherein the first predefined color gamut is formed by connecting three respective points at chromaticity coordinates of red color, green color and second blue color of first three primary colors corresponding to the red sub-pixel, the green sub-pixel and the second blue sub-pixel with three straight lines; and
controlling the second blue sub-pixel in the pixel to perform the RGB three-primary-color display together with the red sub-pixel and the green sub-pixel in response to the chromaticity coordinate of the pixel in the first predefined color gamut; and controlling the first blue sub-pixel in the pixel to perform the RGB three-primary-color display together with the red sub-pixel and the green sub-pixel in response to the chromaticity coordinate of the pixel not in the first predefined color gamut.

13. The display method for the display apparatus of claim 12, wherein before the obtaining chromaticity coordinates of the plurality of pixels, the display method further comprises:
obtaining the first predefined color gamut.

14. The display method for the display apparatus of claim 12, wherein the obtaining chromaticity coordinates of the plurality of pixels based on the data of the image to be displayed on the display apparatus comprises: analyzing a color to be displayed by each pixel of the plurality of pixels based on the data of the image to be displayed on the display apparatus, thereby obtaining a chromaticity coordinate of the pixel.

15. The display method for the display apparatus of claim 11, wherein light of the second blue color has a wave peak in a range of 480~490 nm.

16. The display method for the display apparatus of claim 15, wherein the second blue color has a y value of greater than 0.08 in the chromaticity coordinate.

17. A display apparatus, comprising:

a plurality of pixels, at least one of which comprises a red sub-pixel, a green sub-pixel, a first blue sub-pixel and a second blue sub-pixel; wherein blue light emitted by the first blue sub-pixel has a wave band of 400~540 nm and blue light emitted by the second blue sub-pixel has a wave band of 420~580 nm, and the red sub-pixel and the green sub-pixel are combined with the first blue sub-pixel or the second blue sub-pixel to perform a RGB three-primary-color display;

the display apparatus further comprises:

a chromaticity coordinate obtaining part configured to obtain chromaticity coordinates of the plurality of pixels based on data of an image to be displayed on the display apparatus;

a determination part configured to determine whether a chromaticity coordinate of any one of the plurality of pixels is in a first predefined color gamut; wherein the first predefined color gamut is formed by connecting three respective points at chromaticity coordinates of red color, green color and second blue color of first three primary colors corresponding to the red sub-pixel, the green sub-pixel and the second blue sub-pixel with three straight lines; and a controller configured to control the second blue sub-pixel in the pixel to display together with the red sub-pixel and the green sub-pixel if the chromaticity coordinate of the pixel is in the first predefined color gamut; and to control the first blue sub-pixel in the pixel to display together with the red sub-pixel and the green sub-pixel if the chromaticity coordinate of the pixel is not in the first predefined color gamut;

the display apparatus further comprises:

a color gamut obtaining part configured to obtain the first predefined color gamut; and wherein the chromaticity coordinate of the red color of the first three primary colors is a chromaticity coordinate obtained by only lighting up the red sub-pixel in the pixel and turning off the green sub-pixel and the first and the second sub-pixels blue in the pixel;

the chromaticity coordinate of the green color of the first three primary colors is a chromaticity coordinate obtained by only lighting up the green sub-pixel in the pixel and turning off the red sub-pixel and the first and second blue sub-pixels; and the chromaticity coordinate of the blue color of the first three primary colors is a chromaticity coordinate obtained by only lighting up the second blue sub-pixel in the pixel and turning off the red and green sub-pixels and the first blue sub-pixels.

18. The display apparatus of claim 17, wherein a second predefined color gamut is formed by connecting three respective points at chromaticity coordinates of red color, green color and second blue color of second three primary colors corresponding to the red sub-pixel, the green sub-pixel and the first blue sub-pixel with three straight lines; and the chromaticity coordinate of a first color of the second three primary colors is a chromaticity coordinate obtained by only lighting up the first blue sub-pixel in the pixel and turning off the red and green sub-pixels and the second blue sub-pixels.

19. The display apparatus of claim 18, wherein only a part of the first predefined color gamut overlaps the second predefined color gamut.

20. The display apparatus of claim 17, wherein light of the second blue color has a wave peak in a range of 480~490 nm.

* * * * *